United States Patent
Kumar

[11] Patent Number: 5,960,305
[45] Date of Patent: Sep. 28, 1999

[54] METHOD TO IMPROVE UNIFORMITY/ PLANARITY ON THE EDGE DIE AND ALSO REMOVE THE TUNGSTEN STRINGERS FROM WAFER CHEMI-MECHANICAL POLISHING

[75] Inventor: Kuppam S. Kumar, Sunnyvale, Calif.

[73] Assignee: LSI Logic Corporation, Milpitas, Calif.

[21] Appl. No.: 08/771,472

[22] Filed: Dec. 23, 1996

[51] Int. Cl.$^6$ .......................... H01L 21/28; H01L 21/302
[52] U.S. Cl. .......................... 438/598; 438/629; 438/633; 438/669
[58] Field of Search ..................................... 438/597, 598, 438/629, 631, 633, 645, 647, 666, 669, 672

[56] References Cited

U.S. PATENT DOCUMENTS

| | | | |
|---|---|---|---|
| 4,816,895 | 3/1989 | Kikkawa ................................. | 257/757 |
| 5,328,553 | 7/1994 | Poon ....................................... | 438/633 |
| 5,366,911 | 11/1994 | Lur et al. .............................. | 438/282 |
| 5,453,583 | 9/1995 | Rostoker et al. ....................... | 174/267 |
| 5,459,340 | 10/1995 | Anderson et al. ...................... | 257/203 |
| 5,530,294 | 6/1996 | Kim ....................................... | 257/774 |
| 5,607,877 | 3/1997 | Matsuda et al. ........................ | 438/613 |
| 5,726,099 | 3/1998 | Jaso ........................................ | 438/693 |

*Primary Examiner*—T. N. Quach
*Attorney, Agent, or Firm*—Beyer & Weaver, LLP

[57] ABSTRACT

A process of making an IC wafer including a surface with improved uniformity, planarity and a reduced likelihood of creating stringers is disclosed. The process includes: depositing a layer of polysilicon or metallization on the surface having a die region including a plurality of die that are disposed interior to a perimeter of the surface and a peripheral region disposed outside the die region and abutting the die region of the surface; depositing a layer of photoresist on the layer of metallization; exposing the layer of photoresist to radiation to define a mask on an area in the die region and designated to form the plurality of die; exposing at least a portion of the layer of photoresist to radiation to define the mask in the peripheral region of the wafer surface; and etching the layer of metallization underlying unmasked portions of the photoresist in the peripheral region along with the die region of the surface to limit material build-up on the peripheral region and form metal contact regions underlying the masked portions.

14 Claims, 12 Drawing Sheets

METHOD TO IMPROVE UNIFORMITY/ PLANARITY ON THE EDGE DIE AND ALSO REMOVE THE TUNGSTEN STRINGERS FROM WAFER CHEMI-MECHANICAL POLISHING

BACKGROUND OF THE INVENTION

The present invention relates to methods for providing uniform, planar integrated circuit (IC) wafer surfaces and removing tungsten stringers from such surfaces. More particularly, the present invention relates to photolithography and etching procedures for achieving these goals.

Figure 1:
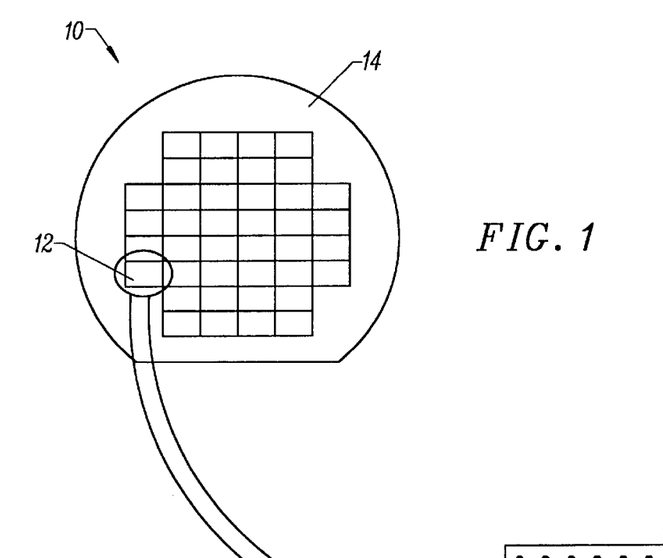
FIG. 1 shows a top view of an integrated circuit (IC) wafer surface having a die region and a peripheral region.

FIG. 1 shows a top view of a typical semiconductor wafer 10 having an active die region 12 and a peripheral region 14. Transistor devices, such as metal oxide semiconductor (MOS) transistor devices, are located in the ICs (die) that make up die region 12. Peripheral region 14 or the "exclusion zone," as it is known, is the part of the wafer surrounding die region 12. Peripheral region 14, tends to be relatively large, i.e. typically about 1 cm or more (in the radial direction) from the edge of wafer 10.

It has been found that by the end of the IC fabrication process, this peripheral region is typically elevated about 3–5 micrometer ($\mu$m) above die region 12. The difference in the height of die region 12 and peripheral region 14 results from material build-up in peripheral region 14 during conventional wafer fabrication processes.

Most IC wafer fabrication processes can be divided into "front end" steps and "back end" steps. Front end steps generally include those steps necessary to form the actual transistor elements such as source/drain regions, gates, and isolation regions. Back end steps generally include those process steps necessary to create circuitry by wiring the various transistors formed by the front end processing. The material build up in the peripheral region of the wafer surface is primarily a result of the back end steps.

FIGS. 2A–2J show a cross-section of a semiconductor wafer surface that undergoes typical back end steps, which result in the material build up in the peripheral region. It should be noted that metal oxide semiconductor (MOS) transistor elements, for example, are formed near the semiconductor surface, but are not shown to simplify illustration.

Figures 2A, 2B:
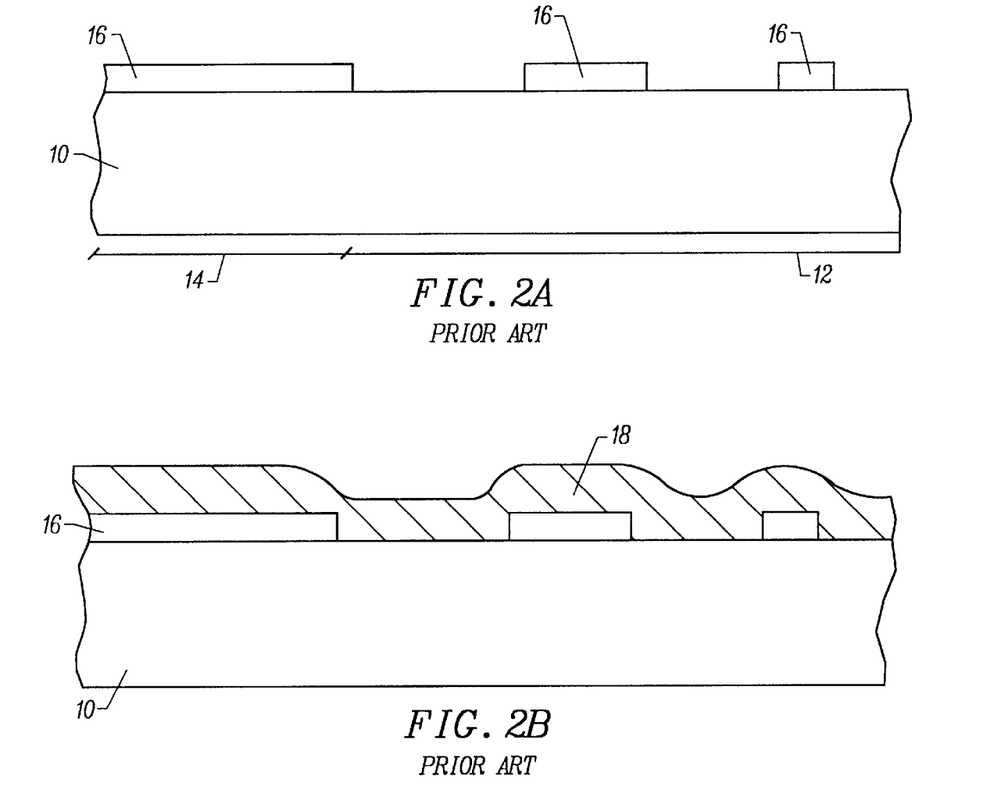
FIGS. 2A–2J show side-sectional views of a wafer peripheral region and die adjacent peripheral region at various stages of fabrication according to conventional methods.

According to a conventional wafer fabrication process, a gate layer, e.g., a layer of polysilicon, is blanket deposited on the semiconductor wafer surface including a die region and a peripheral region. Portions of the wafer surface are thereafter appropriately masked where, for example, gate electrodes and gate level jumpers for connecting the various transistor elements, are to be formed. FIG. 2A shows polysilicon structures 16 that are formed by anisotropically etching the polysilicon disposed above the surface of wafer 10. It is important to note that the polysilicon layer in die region 12 undergoes etching as desired, but a substantial amount of the polysilicon layer in peripheral region 14 remains unetched. Peripheral region 14 remains unetched primarily because patterning of the layer of photoresist that takes place in the die region to form die is not carried out in the peripheral region where die are not present.

Figure 2C:
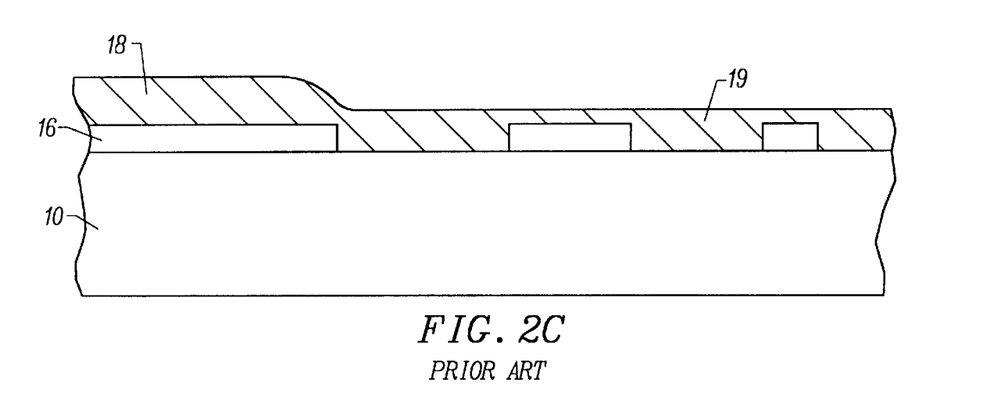

After polysilicon structures 16 are formed, dielectric layer 18, as shown in FIG. 2B, is conformally deposited over the entire wafer surface of FIG. 2A in order to insulate polysilicon structures 16 from a subsequent metallization layer. Dielectric layer 18 is commonly referred to as an inter layer dielectric 1 (ILD1) in the wafer fabrication art. FIG. 2C shows that dielectric layer 18 is then planarized by a process such as chemi-mechanical polishing, which involves mounting a wafer upside down on a holder and rotating it on against a polishing pad mounted on a pallet, which is rotating in the other direction. A slurry containing a chemical capable of dissolving the wafer layer to be planarized and an abrasive that physically removes the layer to be planarized, is flowed between the wafer and the polishing pad.

It should be noted that during planarization, the narrow protuberances of dielectric above the etched metal lines are almost completely removed to form a planarized dielectric layer 19, while the material removal in the peripheral region is relatively insignificant. Dielectric layer 19 in the die region is, therefore planarized to a relatively low level, while dielectric layer portion 18 in the peripheral region remains elevated. This is because dielectric layer 18 in the peripheral region remains deposited on the unetched portions of gate layer 16.

Figure 2D:
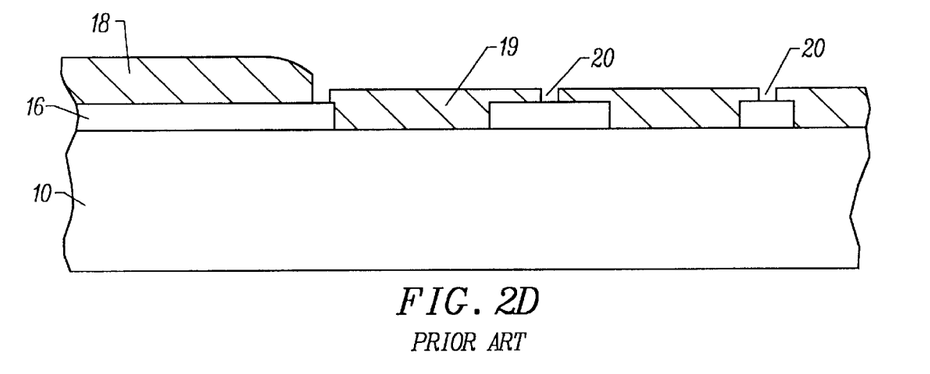

Next, a via mask is formed on the upper surface of dielectric layer 19 by forming a layer of photoresist and using conventional photolithography techniques to pattern the layer of photoresist. The via mask will define vias or regions where interconnects between polysilicon structures 16 and a subsequent metallization layer are to be formed. FIG. 2D shows the formation of actual vias 20 in dielectric layer 19. Such vias are typically formed by a plasma assisted etch.

Figure 2E:
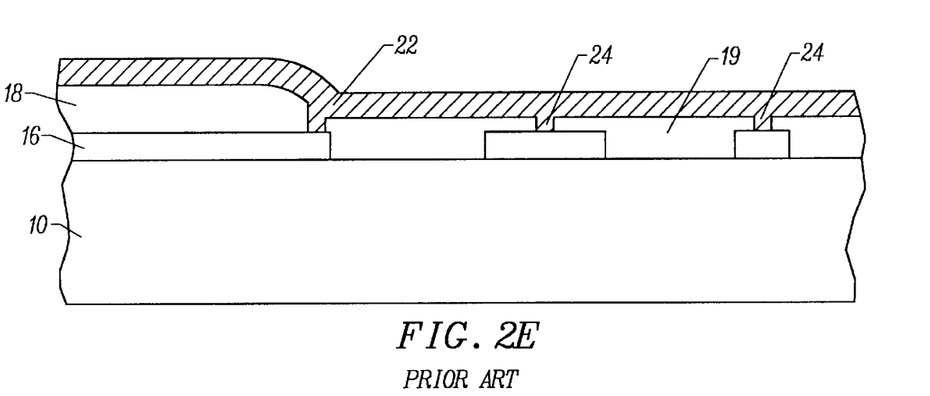
Figure 2F:
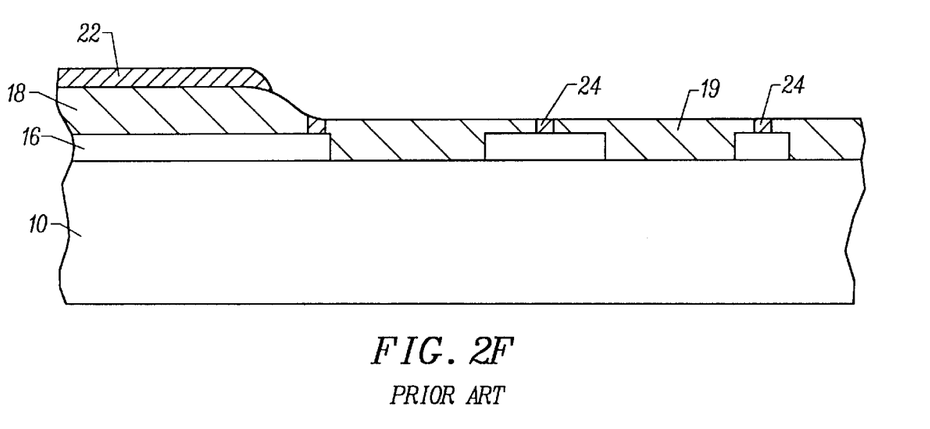

As shown in FIG. 2E, a conductive layer 22, e.g., tungsten or aluminum, is then deposited over the entire wafer surface, filling vias 20 of FIG. 2D. Next, conductive plugs 24, as shown in FIG. 2F, are formed by subjecting the entire wafer surface to chemi-mechanical polishing described above. During chemi-mechanical polishing, the die region of the wafer surface undergoes significant material removal and conductive layer 22 is removed in the open areas to form conductive plugs 24. In the peripheral region, however, the accumulated build, e.g., polysilicon structure 16 and ILD1, impairs the polishing process because the polishing pad rides up at the peripheral region and thereby exerts a lower polish pressure per square inch in the peripheral region than in the die region. As a result, a portion of conductive layer 22 does not undergo material removal during chemimechanical polishing in the peripheral region, where a significant portion of conductive layer 22 remains on the non-planarized dielectric layer 18. This residual conductive layer, which may include tungsten as mentioned above, in the peripheral region is well known in the art as a "tungsten stringer" and is discussed below.

Figure 2G:
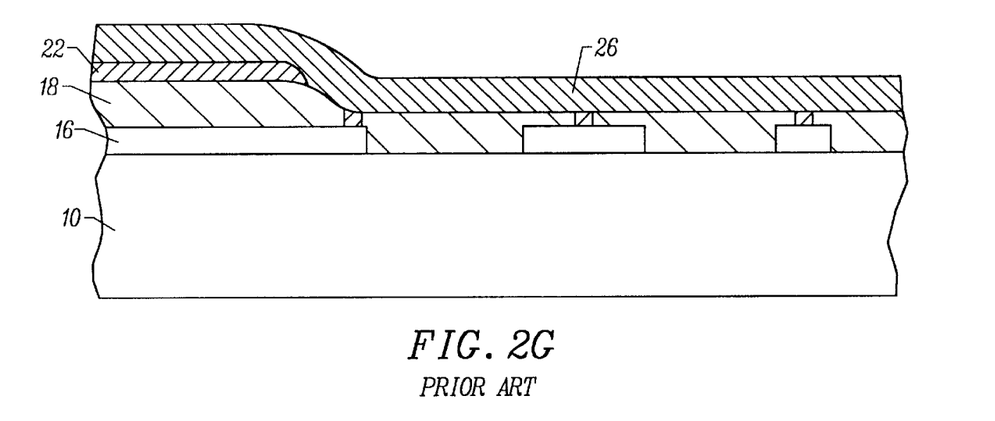
Figure 2H:
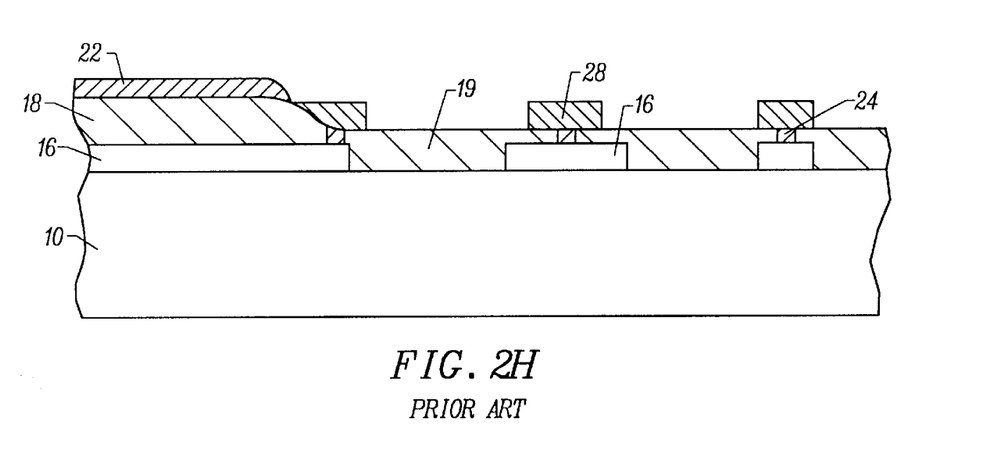

FIG. 2G shows a first metallization layer (M1) 26, which is blanket deposited over the entire wafer surface typically by sputtering or chemical vapor deposition, as is well known in the IC fabrication art. In FIG. 2H, metallization layer 26 is patterned (in the die region only) as described below to form lines 28. As shown in this figure, near the peripheral region, one of lines 28 contacts tungsten stringer 22. For the sake of maintaining continuity, the effects of having lines 28 very close to or contacting tungsten stringer 22 will be discussed below in detail.

Lines 28 typically form a network of connections between the various transistor elements. The exact layout of the lines will be determined by the particular IC or ASIC design. The patterning is done first by depositing a mask such as a photoresist and then exposing only the mask in the die region to light to define the pattern of metal lines to be created in a subsequent etch step. Thereafter, according to FIG. 2H, the underlying first metallization layer in the die region is etched by a plasma process such as reactive ion etching (RIE) to form lines 28.

Figure 2I:
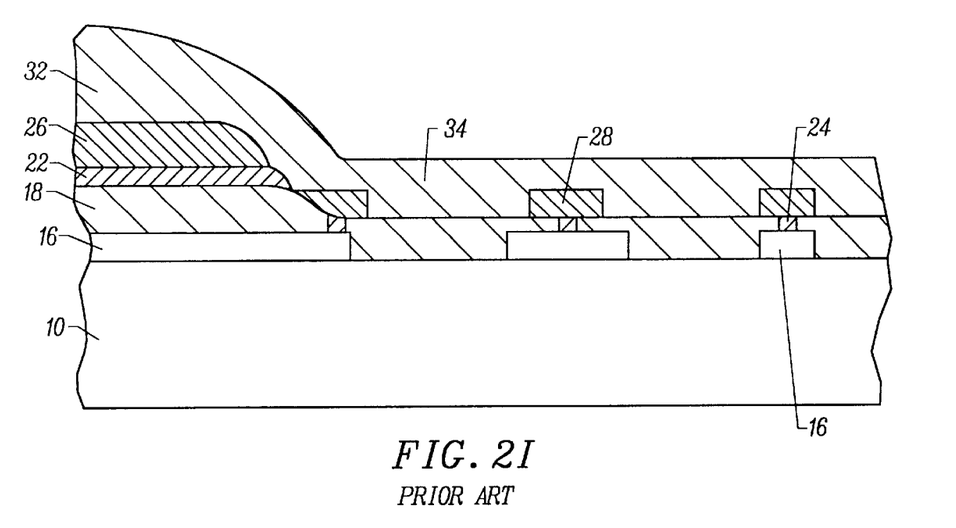

After etching, the photoresist is removed and another dielectric layer 32, also referred to as inter layer dielectric 2 (ILD2) or Inter Metal Dielectric (IMD), is conformally deposited over the entire wafer surface and then planarized in the die region to form a planarized dielectric layer 34 as shown in FIG. 2I. Dielectric layer 32 is typically planarized by chemi-mechanical polishing. However, the accumulated build up, e.g., polysilicon structure 16, ILD1, and M1, in the peripheral region substantially impairs the polishing process because the polishing pad significantly rides up at the peripheral region. As a result, even after polishing, the wafer surface has a significant variation in the surface topography.

Figure 2J:
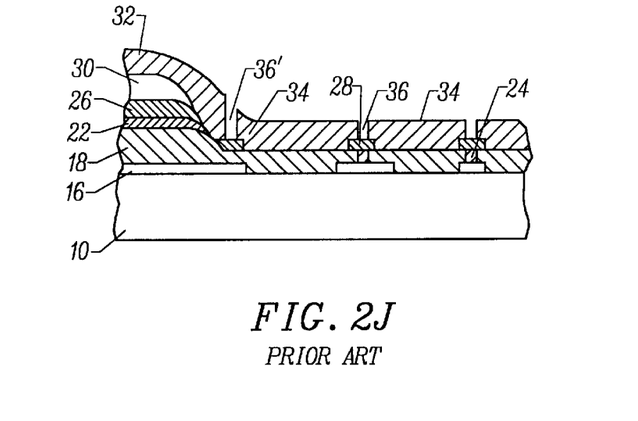

As shown in FIG. 2J, vias 36 are then formed in dielectric layer 34 as already described above in the discussion corresponding to FIG. 2D.

Unfortunately, near the peripheral region a via 36' may not extend all the way to contact line 26, as shown in FIG. 2J. The formation of such vias and their effects are described below in significant detail.

These vias are then filled with a conductive layer, which is etched in the die region according to the discussion corresponding to FIG. 2F, to form conductive plugs. The unetched conductive layer in the peripheral region is disposed above non-planarized dielectric layer 32, further contributing to the accumulated build up.

One skilled in the art may appreciate that in this manner more dielectric and metallization layers may be fabricated over the wafer surface. Furthermore, as layer after layer of metallization and dielectric material are fabricated, the peripheral region of the wafer surface experiences a significant build up or accumulation of such layers. This results in a "step profile," i.e. the various layers described above form a stacked structure in the peripheral region.

Figure 3:
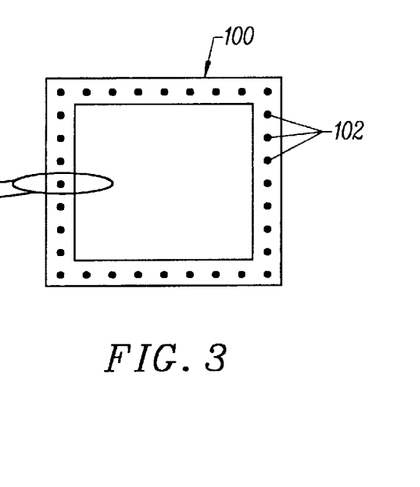
FIG. 3 shows a top view of an edge die located near the peripheral region of the wafer surface having bond pads that are affected by the material build up in the peripheral region according to the prior art.

Unfortunately, the conventional method of wafer fabrication, as described above, has several drawbacks. These drawbacks are well known in the art as being caused by the material build up at the peripheral region of the wafer surface and referred to as shadow effects. Referring back to FIG. 1, which shows an edge die 100 abutting peripheral region 14. At least one side of the edge die is, therefore, adjacent to the significant material build up of the peripheral region. FIG. 3 shows edge die 100 magnified to emphasize details of interest. As shown in this figure, edge die 100 has a plurality of bond pads 102 around the perimeter of the die. Thus, some bond pads 102 will be surrounded by the build up of the peripheral region.

As an example of a first drawback, before the etching step of FIG. 2J is performed to form vias, the material build up in the peripheral region causes poor planarization of ILD2. The variation of the surface topography, especially near the peripheral region, remains pronounced even after the wafer surface undergoes chemi-mechanical polishing. As a result, subsequent photolithography exposures are limited by uneven depth of field (DOF) during imaging when forming masks for vias near the peripheral region and thereby the etching step to form vias suffers significantly.

As another example, the material build up in the peripheral region may not allow the etching to continue far enough near the peripheral region into ILD2 so that the vias fail to extend far enough to contact the underlying metallization layer, as shown in FIG. 2J. In order to establish contact with the underlying metallization, the vias in the die region are typically etched about 4000 Å into the dielectric layer. Due to the non-uniform surface, however, the vias near the peripheral region may require etching distances of up to 7000 Å to establish contact with the underlying metallization. Thus, when ILD2 undergoes etching to form vias, it has sometimes been observed that connections to bond pads and other structures located near the peripheral region may not completely extend to the underlying metallization, rendering the entire die inoperable. Overetching might be able to form contacts to the underlying metallization, but has side effects like loss of process control, critical dimension variation, lateral etching etc.

As a further example, the formation of conductive lines 28 near the peripheral region, as shown in FIG. 2H, may undesirably come in contact with the tungsten stringer to create a short circuit, rendering the edge die inoperable. These examples illustrate a few problems resulting from elevated peripheral regions produced in a conventional wafer fabrication process. Each of these problems lowers the yield of the die fabrication process.

What is needed is a method for effectively fabricating dies on an IC wafer surface and boosting the die yield, especially near the peripheral region.

SUMMARY OF THE INVENTION

To achieve the foregoing, one aspect of the present invention provides an (integrated circuit) IC wafer design for improving uniformity, planarity and a reduced likelihood of creating stringers. The IC wafer includes the following elements: a die region defined in an inner region of the surface and containing a plurality of die; a peripheral region defined outside the die region and around a perimeter of the surface; and one or more partial die formed on the peripheral region such that the partial die would be complete if additional surface area would be available beyond the perimeter. The partial die effectively limit material build-up on the peripheral region such that the entire wafer has improved uniformity, planarity and a reduced likelihood of creating stringers, close to the complete useful die.

At least a portion of the peripheral region may be populated with the partial die, which are next to edge die, i.e. those die adjacent the peripheral region. In one embodiment, the edge die are surrounded by bond pads that are substantially removed from material build up in the peripheral region. Thus, the problem of non-planar die surfaces are alleviated. The edge die of the IC wafer surface may include at least one dielectric layer that is disposed over the peripheral and die regions and has a substantially equivalent elevation with respect to wafer surface across the die and peripheral regions. The edge die may include conductive plugs to connect conductive layers. All such conductive plugs may extend through a dielectric layer to contact an underlying conductive layer. The IC wafer of the present invention may be free of stringers on the peripheral region and the edge die.

Another aspect of the invention provides a process of making an IC wafer including a surface with improved uniformity, planarity and a reduced likelihood of creating stringers is disclosed. The process includes: depositing a layer of polysilicon or metallization on the surface having a die region including a plurality of die that are disposed interior to a perimeter of the surface and a peripheral region disposed outside the die region and abutting the die region of the surface; depositing a layer of photoresist on the layer of metallization; exposing the layer of photoresist to radiation to define a mask on an area in the die region and designated to form the plurality of die; exposing at least a portion of the layer of photoresist to radiation to define the mask in the peripheral region of the wafer surface; and etching the layer of metallization underlying unmasked portions of the photoresist in the peripheral region along with the die region of the surface to limit material build-up on the peripheral region and form metal contact regions underlying the masked portions.

The above mentioned process may include a step of adjusting an opening of shutter blades of a stepper camera lens such that only small portions of the peripheral region are printed. Alternatively, the step of exposing the layer of photoresist in the peripheral region may include simultaneously exposing an entire field, i.e. a pattern for a collection of multiple die (typically four or nine die) to a light source to print an image of the mask.

The step of exposing the layer of photoresist to define a mask on an area in the die region, e.g. by rapidly printing several fields in the die region, may come before the step of exposing at least a portion of the layer of photoresist to define the mask in the peripheral region. Alternatively, the two exposing steps may be performed together. The step of exposing at least a portion of the layer of photoresist in the peripheral region may include exposing a substantial portion of the layer of photoresist to define a mask in the peripheral region. The above mentioned process may further include etching substantially all unmasked portions of the photoresist in the peripheral region along with the die region of the surface to eliminate material build-up on the peripheral region.

The process of making an IC wafer described above may further include: removing the patterned layer of photoresist; depositing a layer of dielectric material on the die and peripheral regions of the wafer surface; exposing the layer of dielectric to radiation to define a mask in the die region; exposing the layer of dielectric to radiation to define the mask in the peripheral region; and etching areas underlying unmasked portions of the layer of dielectric in the peripheral region along with the die region of the surface to limit material build-up on the peripheral region and thereby form vias which extend to the metal contact regions.

After the step of depositing a layer of dielectric material, the wafer fabrication process may further still include a step of planarizing the layer of dielectric material such that the elevation with respect to the wafer surface of the layer of dielectric material is substantially equivalent across the die and peripheral regions. The step of planarizing the layer of dielectric material may include subjecting the surface of the wafer to chemi-mechanical polishing or any other process that involves material removal by abrasion of wafer surface. A conductive layer may deposited over the wafer surface such that some of the conductive material is deposited inside the vias to form conductive plugs. The conductive material may include tungsten or aluminum. After the step of depositing a conductive material, the conductive material may be substantially removed, e.g., chemi-mechanical polishing from the die and peripheral regions such that no stringers are formed.

These and other features of the present invention will be described in more detail below in the detailed description of the invention and in conjunction with the following figures.

DETAILED DESCRIPTION OF THE PREFERRED EMBODIMENTS

The present invention provides an improved method for utilizing an integrated circuit (IC) wafer surface. In the following description, numerous specific details are set forth in order to provide a thorough understanding of the present invention. It will be apparent, however, to one skilled in the art that the present invention may be practiced without limitation to some or all of these specific details.

Figure 4:
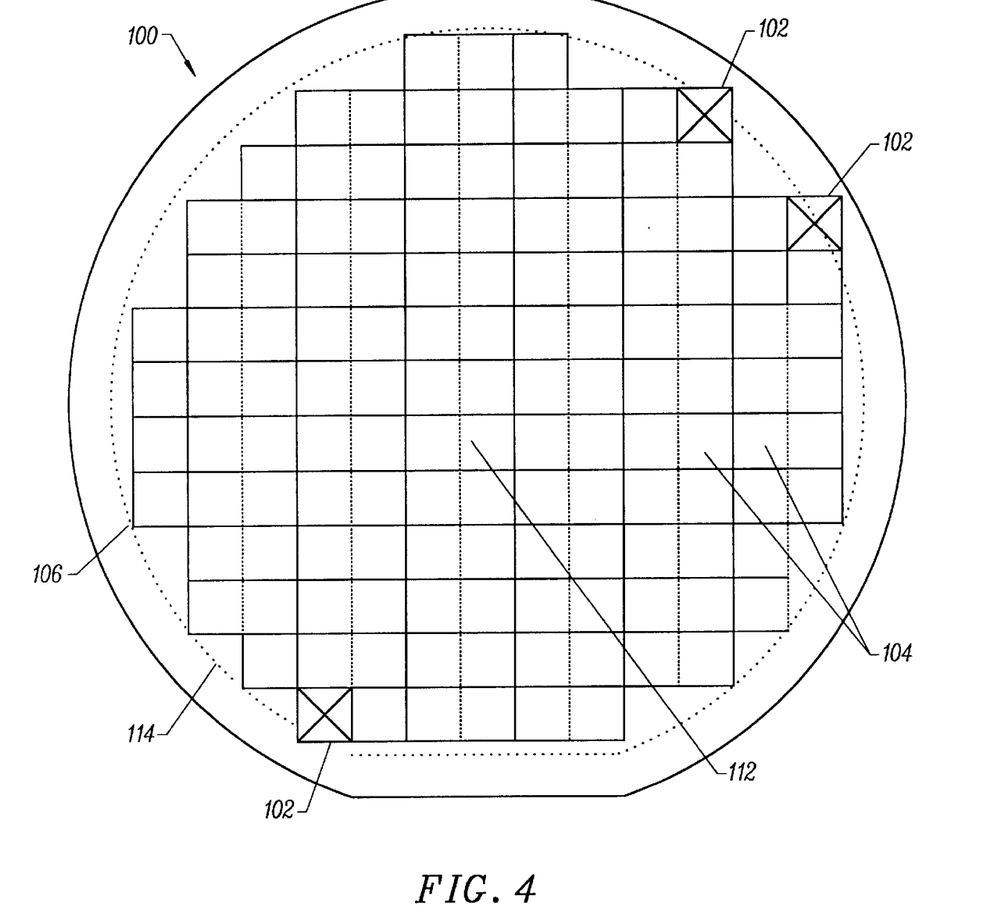
FIG. 4 shows a top view of an IC wafer surface according to one embodiment of the present invention.

FIG. 4 shows an integrated circuit (IC) wafer surface, according to one embodiment of the present invention. An IC 100 has an active die region 112 and a peripheral region 114. An edge bead 106 defines the outer perimeter of peripheral region 114, beyond which there is no material deposition, e.g., layers of metallization, oxide or photoresist. This is because the wafer is held in place by a chuck or other apparatus which grasps the edge of the wafer in a region beyond bead 106. Die region 112 is populated with "complete" die 104. Selected portions of peripheral region 114 are populated with "partial" die 102, which have been marked by "X" (to facilitate identification) and are positioned adjacent to the edge die. Complete die 104 include all circuitry necessary for a functional IC. Partial die 102, in contrast, lack some region of a complete die because that region overlaps edge bead 106.

Partial die 102 would be a completely fabricated die, if additional surface area would have been available beyond the peripheral region. Although die 102 will be inoperative, they effectively curtail significant material build up in peripheral region 114. This is because, similar to die region 112, the area of peripheral region 104 where partial die 102 are located undergoes all IC fabrication steps, including, most importantly, patterning and subsequent etching. As a result, conventional photolithography and chemi-mechanical polishing proceed as normal, to form a partial die. The material build up in peripheral region 114 of this embodiment is avoided next to edge die, as partial die 102 are positioned adjacent to edge die. According to the present invention, these edge die are, therefore, not rendered inoperable from the potential risks, e.g., non-uniformity, poor planarity and conductive stringers such as tungsten stringers, associated with the material build up in peripheral region 114.

Figure 5:
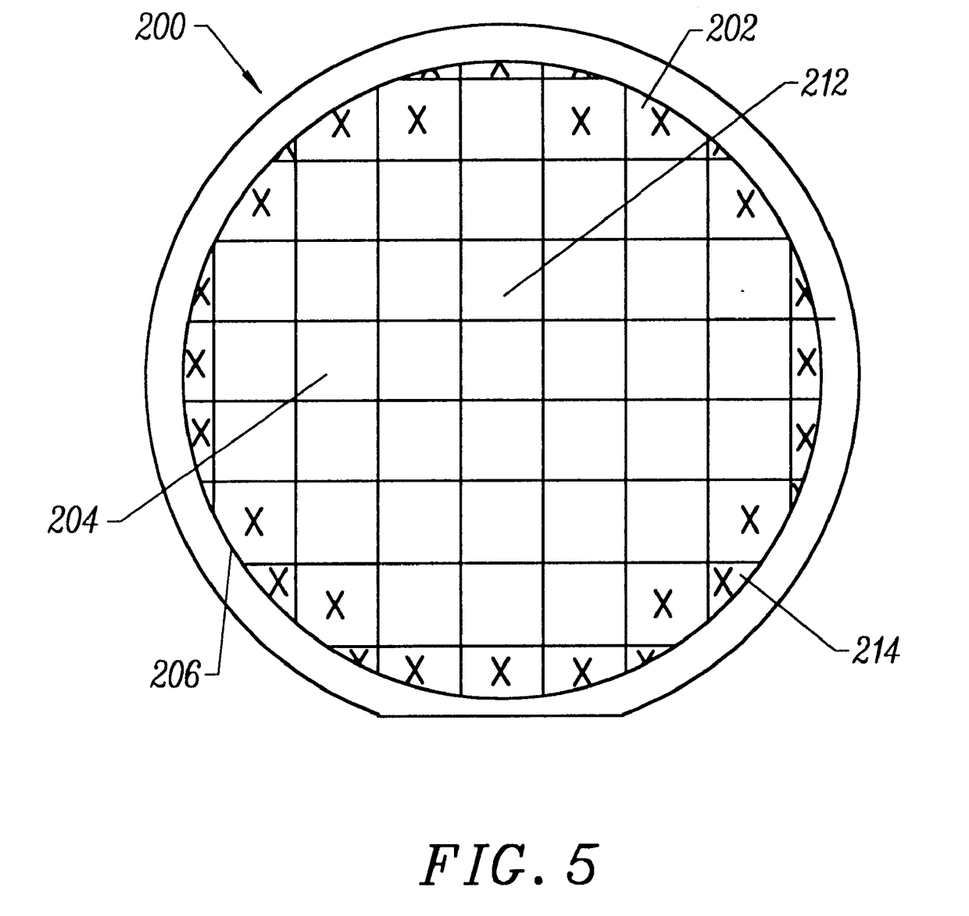
FIG. 5 shows a top view of an IC wafer surface according to an alternative embodiment of the present invention.

FIG. 5 shows an IC wafer surface according to an alternative embodiment of the present invention. An IC 200 has a surface including an active die region 212 and a peripheral region 214. An edge bead 206 defines the outer perimeter of the peripheral region 214, beyond which there is no material deposition, e.g., layers of metallization, oxide or photoresist. Die region 212 is populated with complete die 204 and the entire peripheral region 214 is populated with partial die 202.

The primary difference between the embodiments of FIGS. 4 and 5 is that only a portion of the peripheral region in the embodiment of FIG. 4 is populated with partial die, whereas the entire region of the peripheral region in the embodiment of FIG. 5 is populated with partial die. In other words, the entire peripheral region 214 is subject to the same IC fabrication steps as die region 212. Similar to partial die of FIG. 4, partial die of FIG. 5 also effectively curtail the significant material build up in the peripheral region. Of course, one skilled in the art might appreciate that because the entire peripheral region in the embodiment of FIG. 5 is subject to the IC fabrication steps, such as various etching processes, all edge die in die region 212 will be protected from damage due to material build up, unlike the situation depicted in FIG. 4. Consequently, the embodiment of FIG. 5 will provide a uniform and planar surface over a greater portion of said peripheral region 214. Additionally, the risk of forming conductive stringers, such as tungsten stringers, in the embodiment of FIG. 5 are reduced even further. Of course, in the embodiment depicted in FIG. 4, more of the peripheral region could be occupied by partial die, thereby alleviating most or all of mentioned disparities versus the embodiment depicted in FIG. 5.

FIGS. 6A–6G disclose one embodiment of the inventive process for fabricating an IC wafer surface according to the embodiments depicted in FIGS. 4 and 5. The back end processing steps, as mentioned above, may begin when a gate layer, e.g., a layer of polysilicon, is blanket deposited over the entire IC wafer surface, at least to the edge of the bead. Portions of the wafer surface are thereafter appropriately masked where, for example, gate electrodes and interconnects for connecting the various transistor elements, are to be formed.

The process of forming a mask includes blanket depositing a layer of photoresist on the wafer surface. Next, the photoresist is exposed to radiation, such as UV light or the like, shown through a reticle. The radiation passing through the reticle may be directed onto a wafer by a projection step-and-repeat machine (stepper). The wafer is held on a support which may move the wafer by translation, rotation, or tilt. In this manner, various regions of the wafer are illuminated at different times. The stepper contains the optical and mechanical elements necessary to take the mask image provided by radiation passing through the reticle, maintain or reduce the image as necessary, and provide the image to the photoresist layer on the wafer. In preferred embodiments, the stepper will reduce the image from the reticle by 1×, 5×, or 10×.

The stepper operates by shining radiation through the reticle on one die or a group of adjacent die (a "field"). This illuminates but a portion of the wafer (one or a few die out of several die located over the entire wafer surface). Then the illuminate of the wafer region is stopped and the stepper moves the image area with respect to the wafer, so that a new region of the wafer comes into the image area. At this point, radiation is again shown through the reticle and projected onto the wafer, this time on the new region of the wafer. This process of illumination and "stepping" characterizes the operation of a stepper.

After all die in the die area have been exposed, the wafer surface with the photoresist is then developed to complete the mask formation, and the surface is ready to undergo etching.

Practicing wafer exposure in accordance with the present invention involves exposure of not only the die area of the wafer, but the peripheral wafer region as well. Exposure of the peripheral region may be performed in many different manners. For example, this region may be exposed providing sufficient radiation to illuminate a single die region or a field of die. As will now be explained, certain advantages may sometimes be realized by illuminating a field of die as opposed to a single die.

In most steppers, a field of die is illuminated during most steps in the die region. A field will often be a square pattern of four or nine die which are exposed simultaneously. This substantially speeds the process by which all die on the wafer are exposed. However, not all die on the wafer fit neatly into one field or another. Typically, some edge die adjacent to the peripheral region can not fit into one of the full-field steps. Conventionally, such "odd" edge die are separately exposed through a partial field of one or two die, for example, out of the four or nine total die in the field. To accomplish this result, a shutter in the stepper blocks the radiation path through or to a portion of the reticle field. Thus, rather than illuminating all the die in the field, the stepper illuminates only a subset of the die in the field. While this approach can accurately carve out the die area for illumination, the step of partially closing the shutter significantly slows the process.

In the embodiment of FIG. 4, a mask is defined according to the partial field process to selectively expose only selected portions of the peripheral region (at which locations the partial die are formed). In other words, when forming a mask on the wafer surface in this embodiment, only a portion of the photoresist in the peripheral region undergoes exposure to radiation. As mentioned, this may be accomplished by adjusting the opening in the shutter blades of the stepper camera lens so that only a portion of a field in the peripheral region is printed with the image of the etching mask.

In this embodiment, the wafer is exposed by first rapidly printing one field at a time—without making any adjustments to the opening in the shutter blades of the stepper camera lens—in the central portions of the die region. Thereafter, when all die that cleanly fit into a given field are exposed, the shutter blades are adjusted to print any edge die and any specific sections on the peripheral region designated for containing the partial die. According to this embodiment, a conventional process may take up to 30 seconds to print an area designated for a single partially fabricated die. This embodiment is particularly useful when only certain selected segments of the peripheral region pose material build up problems.

Alternatively, in the embodiment of FIG. 5, because the entire peripheral region is populated with the partial die, the entire peripheral region may undergo exposure to entire fields without adjusting the opening of the stepper camera lens. In a conventional stepper, it takes substantially less time to print the entire die region together with peripheral region. For example, the edge die that might normally be exposed through only partial field illumination can now be exposed in full field illumination, together with certain peripheral regions. Thus, throughput is improved.

Figure 6A:
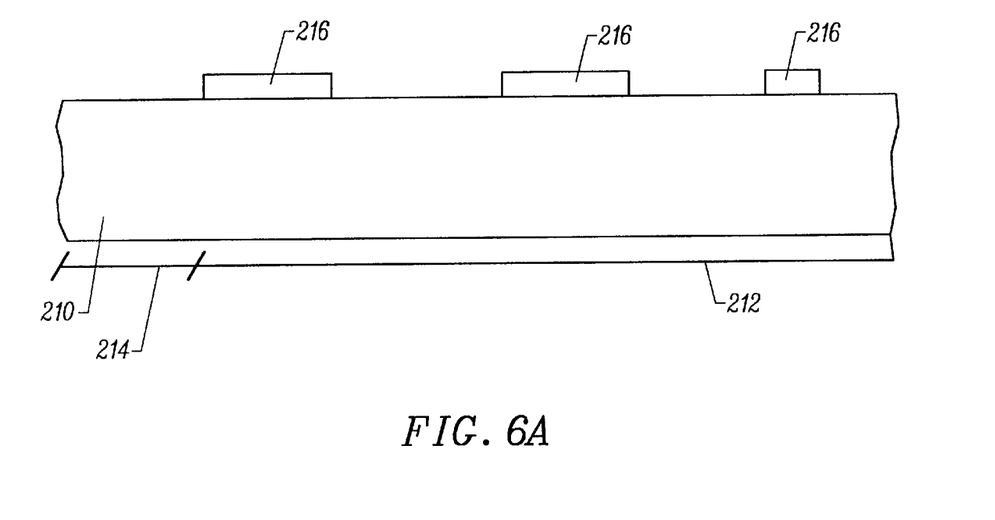
FIGS. 6A–6H show side-sectional views of a wafer peripheral region and die adjacent peripheral region at various stages of fabrication according to one embodiment of the present invention.

As shown in FIG. 6A, selected portions of a polysilicon layer are anisotropically etched to form polysilicon structures 216 (e.g., gates and jumpers) on the surface of wafer 210. It is important to note that the polysilicon layer in a peripheral region 214 undergoes etching like the die region 212. As a result, the unetched, residual polysilicon layer extending over the peripheral region, as found in the prior art, is avoided.

Figure 6B:
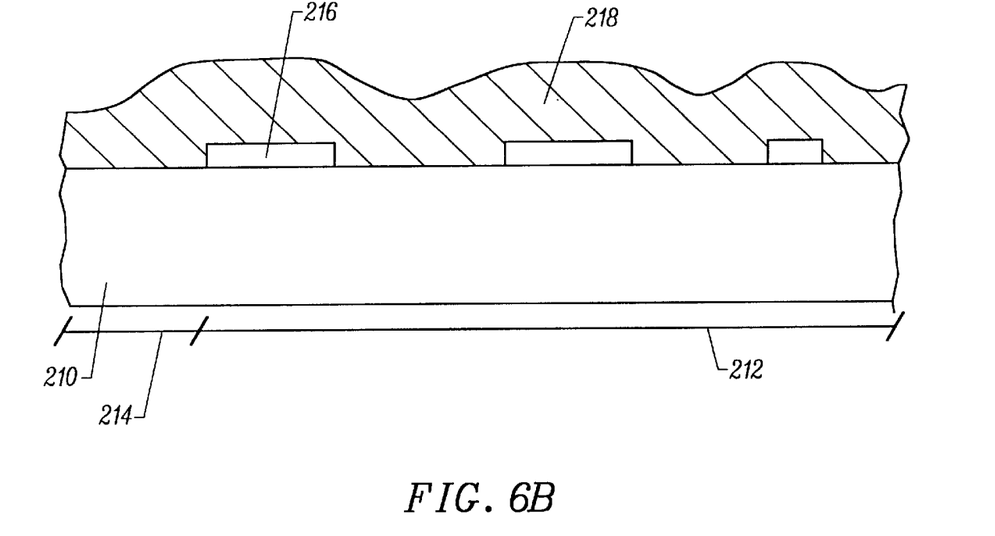
Figure 6C:
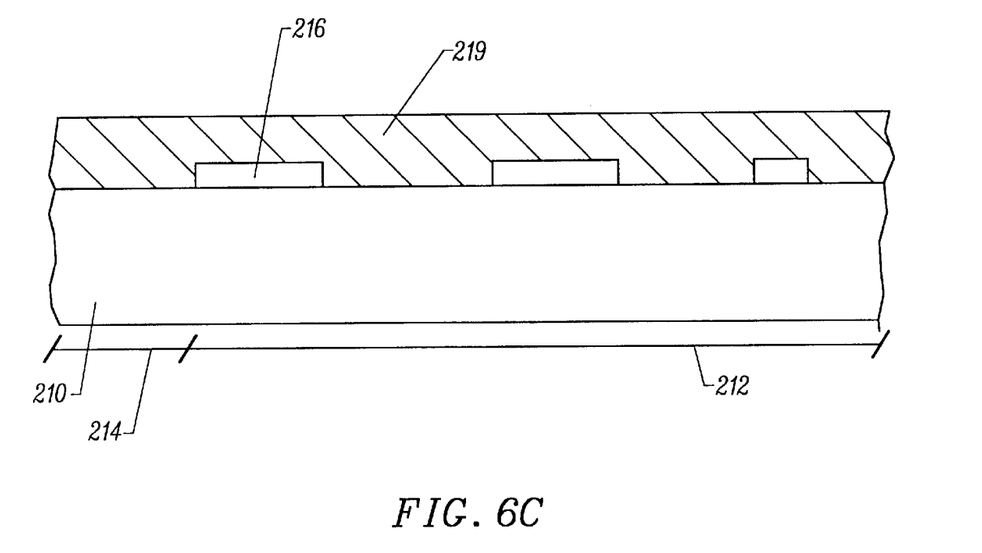

A dielectric layer 218 or ILD1, as shown in FIG. 6B, is then conformally deposited over the entire wafer surface of FIG. 6A in order to insulate polysilicon structures 216 from a subsequent metallization layer. Note that because the polysilicon layer has been etched in peripheral region 214, the top of dielectric layer 218 is not unduly elevated in peripheral region 214. FIG. 6C shows a planarized dielectric layer 219. Planarization may be carried out by any chemi-mechanical polishing technique or other process that involves material removal by abrasion of the wafer surface. Again, it is important to note that after polishing, the top surfaces of the peripheral and die regions is at approximately the same elevation. The planarization in the peripheral region is not impaired in the present invention as it is in the prior art because there is no polysilicon build up in the peripheral region.

Figure 6D:
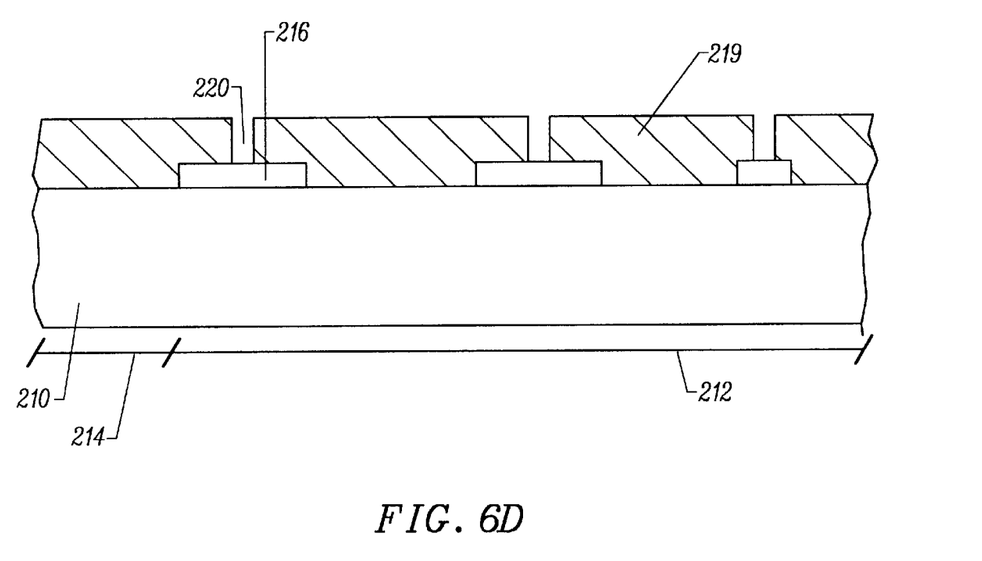

Next, a via mask is formed on the upper surface of dielectric layer 219 by depositing a layer of photoresist. The layer of photoresist above dielectric layer 219 is then patterned by employing techniques similar to those described above for patterning the layer of photoresist over the gate layer. The via mask defines vias or regions where interconnects between polysilicon structures 216 and a subsequent metallization layer are to be formed. FIG. 6D shows the formation of actual vias 220 by then etching dielectric layer 219.

Figure 6E:
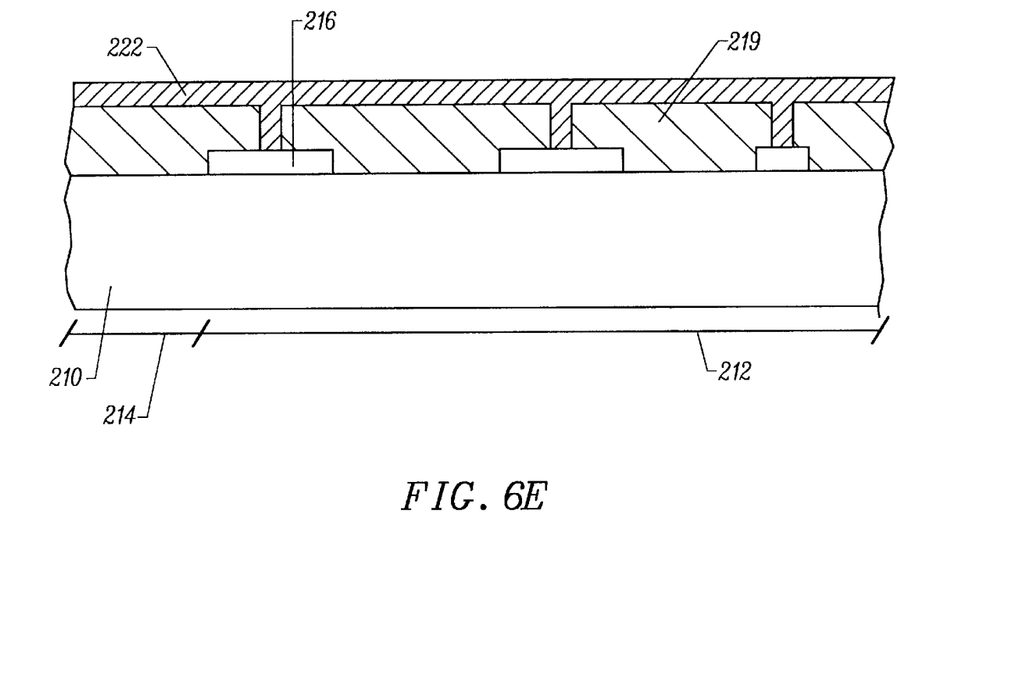
Figure 6F:
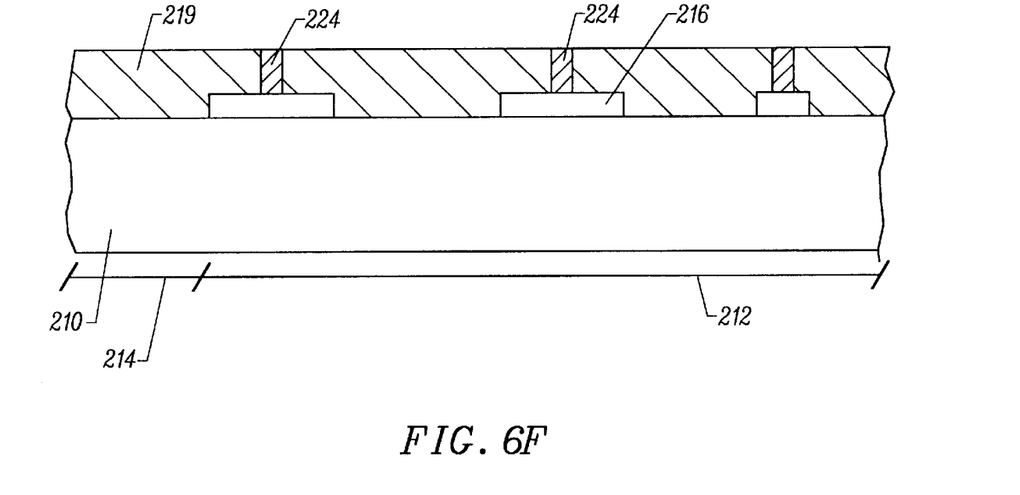

As shown in FIG. 6E, a conductive layer 222, e.g., tungsten or aluminum, is then deposited over the entire wafer surface, filling vias 220 of FIG. 6D. Next, an etch-back process by, for example, chemi-mechanical polishing is performed on the IC wafer surface. As shown in FIG. 6F, the conductive layer 222 in the open areas of the die and peripheral regions is substantially removed to form conductive plugs 224 in vias 220 of FIG. 6D. In the present invention, the material removal in the peripheral region is nearly equivalent to the material removal in the die region. In the absence of accumulated material build up in the peripheral region, the polishing of the peripheral region is unimpaired. As a result, conductive stringers, such as tungsten stringers, which remain on peripheral region of the prior art wafer surface are effectively removed. The removal of conductive stringers, as accomplished by the present invention, marks a significant improvement over the prior art wafer fabrication processes because the risk of creating a short circuit with subsequent conductive lines is totally eliminated.

Figure 6G:
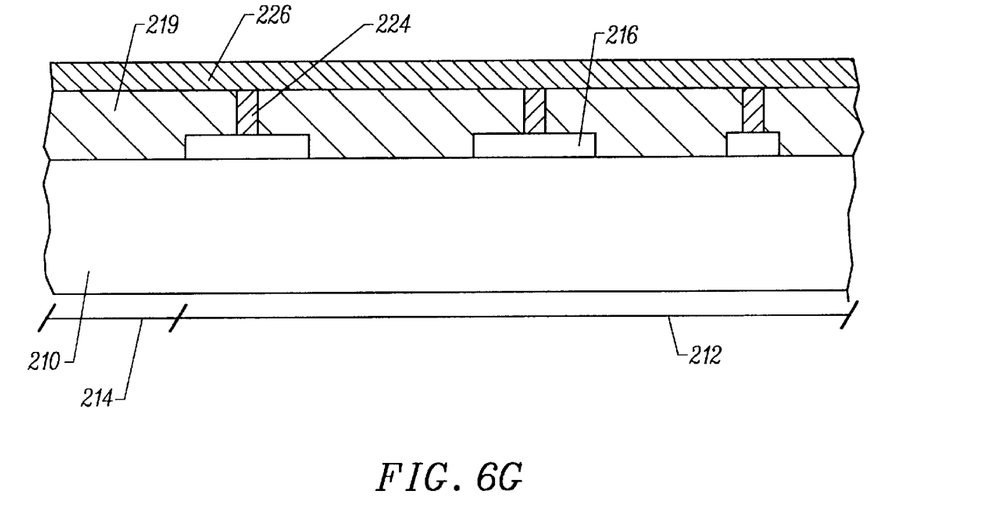
Figure 6H:
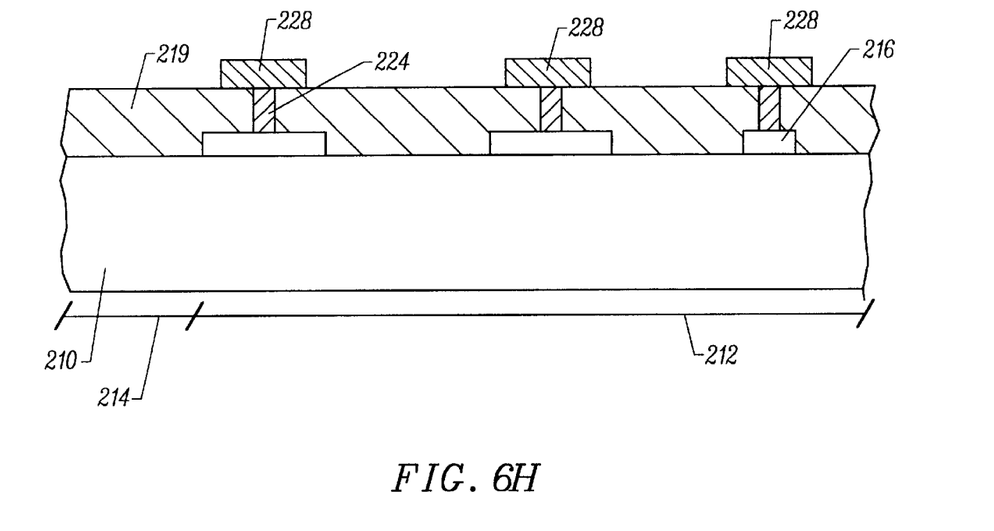

FIG. 6G shows that a first metallization layer (M1) 226 is then blanket deposited over the entire wafer surface typically by sputtering. In FIG. 6H, metallization layer 226 is then patterned to form lines 228. Importantly, the first metallization layer undergoes etching in the peripheral region as well as in the die region. Therefore, the amount of residual unetched metallization remaining in the peripheral region is greatly reduced, thereby avoiding undesired material build up.

After patterning the first metallization layer, another dielectric layer or inter layer dielectric 2 (ILD2) is conformally deposited over the entire wafer surface and planarized as described above. In the absence of material build up in the peripheral region, the ILD2 is also formed uniformly over the die region and peripheral region. Further metallization and dielectric layers are also deposited and patterned as described, always patterning and etching the materials deposited in the peripheral region 214.

In sum, this eliminates the depth of field (DOF) problems experienced by the stepper camera lenses when forming the image of the mask, as encountered in the prior art. Furthermore, when forming vias over such a uniform surface, the potential risk of having a via that fails to extend far enough to contact the underlying metallization layer is avoided. One skilled in the art may appreciate that according to the present invention, several dielectric and metallization layers can be fabricated over the IC wafer surface in this manner.

At the expense of being repetitive, like the die region, at least a portion of the peripheral region in the wafer surface also undergoes patterning and etching during the various fabrication steps. Although the die formed in the peripheral region may be only partially formed, the partial die ensures that the peripheral region contains little or no accumulated material build up. The present invention, therefore, eliminates effects of poor planarity, non-uniformity and formation of conductive stringers that are encountered in the prior art. Wafer fabrication steps according to the present invention translate into higher die yields.

Although the foregoing design has been described in some detail for purposes of clarity of understanding, it will be apparent that certain changes and modifications may be practiced within the scope of the appended claims. For example, while wafer exposure has been described as being performed with a stepper, there is in principle no reason why the process can not also be performed with other exposure apparatus such as projection scanners and contact/proximity aligners. Therefore, the present embodiments are to be considered as illustrative and not restrictive, and the invention is not to be limited to the details given herein, but may be modified within the scope of the appended claims.

What is claimed is:

1. A process of making an IC wafer including a surface with improved uniformity, planarity and a reduced likelihood of creating stringers, comprising:

depositing a layer of polysilicon or metallization on said surface having a die region including a plurality of die and being disposed interior to a perimeter of said surface and a peripheral region disposed outside said die region and abutting said die region of said surface;

depositing a layer of photoresist on said layer of polysilicon or metallization;

exposing on said layer of photoresist to radiation to define a mask on an area in said die region and designated to form said plurality of die;

exposing at least a portion of said layer of photoresist to radiation to define said mask in said peripheral region of said surface; and etching said layer of polysilicon or metallization underlying unmasked portions of said photoresist in said peripheral region along with said die region of said surface to limit material build-up on said peripheral region and thereby form metal contact regions underlying the masked portions.

2. The process of claim 1, prior to said step of exposing said layer of photoresist in said peripheral region, adjusting an opening of shutter blades of a stepper camera lens such that a portion of said peripheral region is printed.

3. The process of claim 2, further comprising etching substantially all unmasked portions of said photoresist in said peripheral region along with said die region of said surface to eliminate material build-up on said peripheral region.

4. The process of claim 1, wherein said step of exposing on said layer of photoresist in said peripheral region comprises simultaneously exposing an entire field to a light source to print an image of said mask, wherein said field is a pattern for a collection of four or nine die.

5. The process of claim 1, wherein said step of exposing said layer of photoresist to define a mask on an area in said die region comes before said step of exposing at least a portion of said layer of photoresist to define said mask in said peripheral region of said surface.

6. The process of claim 1, wherein said two exposing steps are performed together.

7. The process of claim 6, wherein said step of exposing at least a portion of said layer of photoresist in said peripheral region comprises exposing a substantial portion of said layer of photoresist to radiation to define a mask in said peripheral region of said surface.

8. The process of claim 1, further comprising:
   removing said patterned layer of photoresist;
   depositing a layer of dielectric material on said die regions and said peripheral regions of said surface;
   exposing said layer of dielectric to radiation to define a mask in said die region;
   exposing said layer of dielectric to radiation to define said mask in said peripheral region; and
   etching areas underlying unmasked portions of said layer of dielectric in said peripheral region along with said die region of said surface to limit material build-up on said peripheral region and thereby form vias which extend to said metal contact regions.

9. The process of claim 8, wherein after said step of depositing a layer of dielectric material, planarizing said layer of dielectric material such that the elevation with respect to said wafer surface of said layer of dielectric material is substantially equivalent across said die region and said peripheral region.

10. The process of claim 9, wherein said step of planarizing said layer of dielectric material comprises subjecting said surface of said wafer to chemi-mechanical polishing.

11. The process of claim 8, further comprising depositing a conductive layer over said surface of said wafer such that some of said conductive layer is deposited inside said vias to form conductive plugs.

12. The process of claim 11, wherein conductive layer comprises tungsten or aluminum.

13. The process of claim 11, wherein after said step of depositing a conductive layer, removing substantially said conductive layer from said peripheral region and those die adjacent said peripheral region such that no stringers are formed.

14. The process of claim 13, wherein said step of removing substantially said conductive material comprises subjecting said surface of said wafer to chemi-mechanical polishing.

* * * * *